United States Patent [19]

Shuey

[11] 3,766,409

[45] Oct. 16, 1973

[54] AC POWER CONTROL APPARATUS WITH IMPROVED SWITCH DRIVER MEANS

[75] Inventor: Kenneth C. Shuey, Wapakoneta, Ohio

[73] Assignee: Westinghouse Electric Corporation, Pittsburgh, Pa.

[22] Filed: Aug. 4, 1971

[21] Appl. No.: 168,906

[52] U.S. Cl. ......... 307/252 T, 307/252 N, 307/310, 307/311

[51] Int. Cl. .......................................... H03k 17/72

[58] Field of . :ch........... 307/310, 252 N, 252 T, 307/311

[56] References Cited

UNITED STATES PATENTS 3,334,244 8/1967 Hanchett ........................ 307/310 X 3,278,823 10/1966 Ross................................ 307/252 N

*Primary Examiner*—John Zazworsky

*Attorney*—A. T. Stratton et al.

[57] ABSTRACT

AC power control apparatus with reduced power dissipation is provided wherein a three terminal semiconductor switch, such as thyristor, has a gate driver circuit that includes a resistive impedance and a semiconductor device having a P-N junction connected in parallel with the resistive impedance. The semiconductor switch requires less gate current to initiate switching with higher temperature. The P-N junction exhibits a voltage drop thereacross that is inversely proportional to temperature so that a current through said resistive impedance is decreased with increased temperature.

10 Claims, 3 Drawing Figures

AC POWER CONTROL APPARATUS WITH IMPROVED SWITCH DRIVER MEANS

BACKGROUND OF THE INVENTION

1. Field of the Invention

This invention relates to an electronic apparatus and particularly to improved driver circuit means for semiconductor switch devices.

2. Prior Art

To control power in an AC load circuit semiconductor switch devices have been used because of their inherent advantages over mechanical and electromechanical switching elements. A popular form of AC switch comprises a pair of thyristors connected in inverse parallel fashion which requires a driver circuit for the gate terminal of each of the thyristors. There are several known methods to supply gate drive current to inverse parallel thyristors. These methods include pulse drive, continuous drive and load current drive.

Load current drive is an efficient method in which the load current is steered to the thyristor gate terminal until sufficient current to turn on the thyristor is reached. This technique has a disadvantage in that it is necessary for the alternating voltage of the system to be beyond the zero crossover point to turn on the thyristor. The result is a voltage spike across the switch at each zero current crossover point for all load conditions. Such a spike can result in the generation of substantial radio frequency interference. For light load conditions, the percent of load current needed to gate the thyristor increases and results in an even larger voltage spike at each zero voltage crossover point.

The pulse drive technique requires a synchronizing circuit to insure that gate pulses are initiated at zero current crossover points. If the load current is too small, the thyristors would not sustain conduction beyond the pulse application as the load current is below the holding current of the devices. This condition is unsatisfactory in many applications.

The continuous drive method is preferred to avoid the problem of voltage spikes and also the problems occurring with light load currents. Application of continuous gate drive does however introduce problems of power dissipation to the extent that the applied gate current is in excess of that required to turn on the thyristor. Thyristors are characterized by having a required gate current that is inversely proportional to the temperature of the device. Thus, while a first level of gate current would be required to turn on a cold device, a substantially less gate current would be required to turn on a device at an elevated operating temperature. In complex electrical systems with a high component density, such as aircraft electrical systems, it is highly desirable for purposes of reliability to minimize power dissipation.

Present techniques for continuous gate drive of inverse parallel thyristors include that in which a free running core timed oscillator (sometimes referred to as a Royer square wave oscillator) applies a DC signal to each of the gate electrodes for initiating the conduction of the devices. As presently applied this techniques does not permit the reduction of the gate drive upon the device reaching an elevated temperature. Also, for adequate control voltage isolation the oscillator transformer, as well as the power transformer, are required to be large.

Additional background on gate drive or trigger circuits for thyristors used as AC switches may be had by reference to Gentry et al., *Semiconductor Controlled Rectifiers*, Prentice-Hall, Inc. 1964, particularly section 7.3.

SUMMARY OF THE INVENTION

The invention provides a means for minimizing the current to the gate electrode of a three terminal semiconductor switching device, such as a thyristor, even though driven continuously. A current source is provided in series with each gate terminal that includes means for temperature compensation wherein a resistive impedance is connected in parallel with a P-N junction of a semiconductor device such as a transistor. This arrangement takes advantage of the fact that the P-N junction is characterized by a voltage drop thereacross that is inversely proportional to the temperature of the device while the resistive impedance is less temperature sensitive. Where the P-N junction device is in thermal proximity with the switching device, that junction permits the reduction of the current through the resistive impedance as the temperature of the switch increases so that there is applied to the gate terminal an effective gate current of minimal magnitude.

DRAWING

PREFERRED EMBODIMENTS

Figure 1:
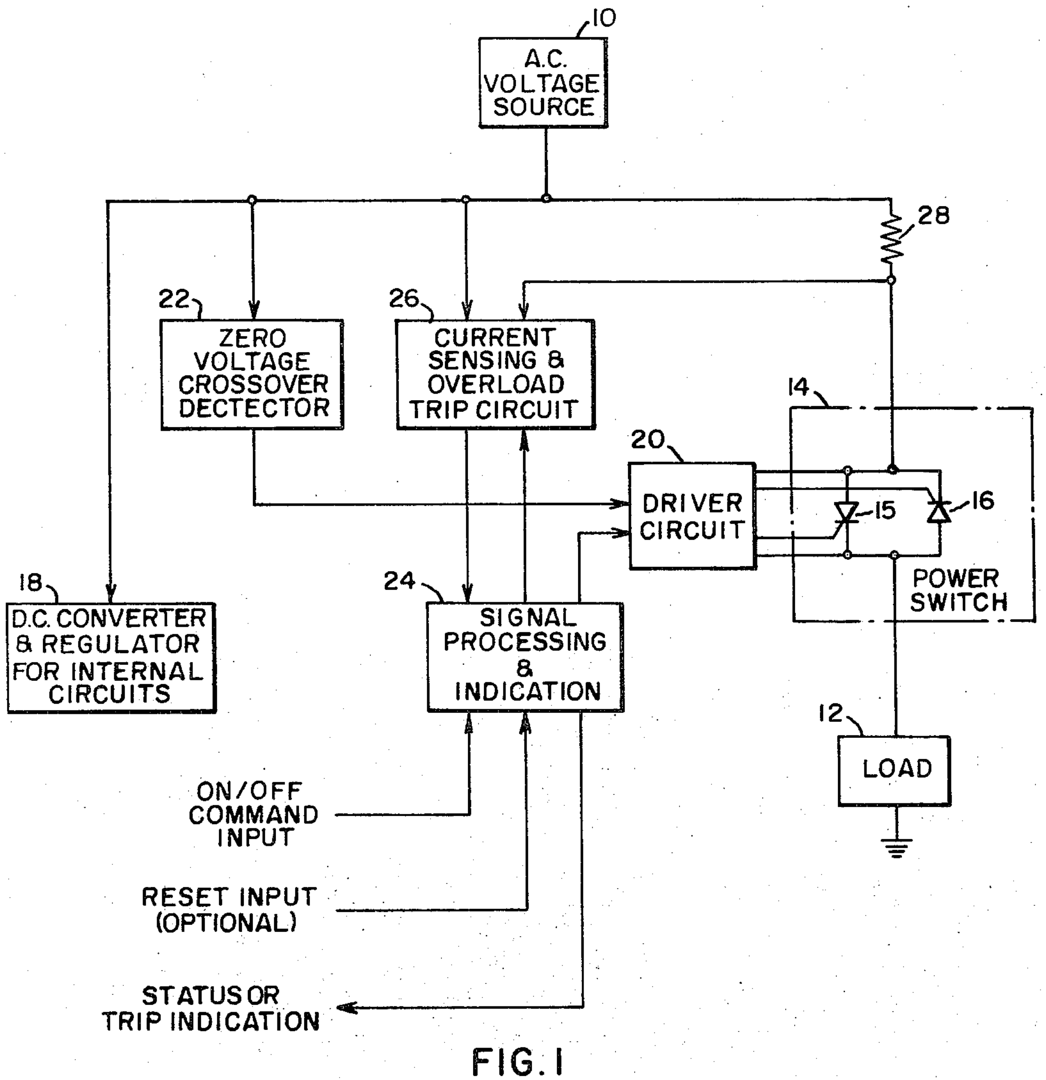
FIG. 1 is a circuit schematic in block diagram form of an exemplary system in which the application of the present invention is particularly advantageous.

FIG. 1 generally illustrates a system wherein alternating voltage from a source 10 to a load 12 is controlled by a power switch 14 that includes a pair of inverse parallel thyristors 15 and 16.

The alternating voltage from source 10 is also used to power the internal circuits. For that reason there is shown a block 18 labelled "DC Converter and Regulator for Internal Circuits" connected to the alternating voltage source 10 which would have outputs (not shown) to various other of the internal circuits. The power switch 14 is directly controlled by a circuit portion 20 indicated as a "Driver Circuit" connected to the gate element of each of the thyristors 15 and 16. The driver circuit 20 has an input from a block 22 labelled "Zero Voltage Crossover Detector" which is a known means for permitting the operative effect of signals for initial turn-on to the driver circuit 20 only upon the occurrence of a crossover of the AC voltage waveform. Such a signal is developed by the "Signal Processing and Indication" block 24. Other elements illustrated include a block 26 for "Current Sensing and Overload Trip Circuit" which develops a sensing current from a current sensing shunt 28 in the load current path and provides one of the inputs to block 24. Further description of a system as illustrated in FIG. 1 and its operation may be had by referring to a paper entitled "Power Controllers for Automatically Controlled Electrical Systems" by D. E. Baker appearing in *NAECON Proceedings*, May 1971.

Figure 2:
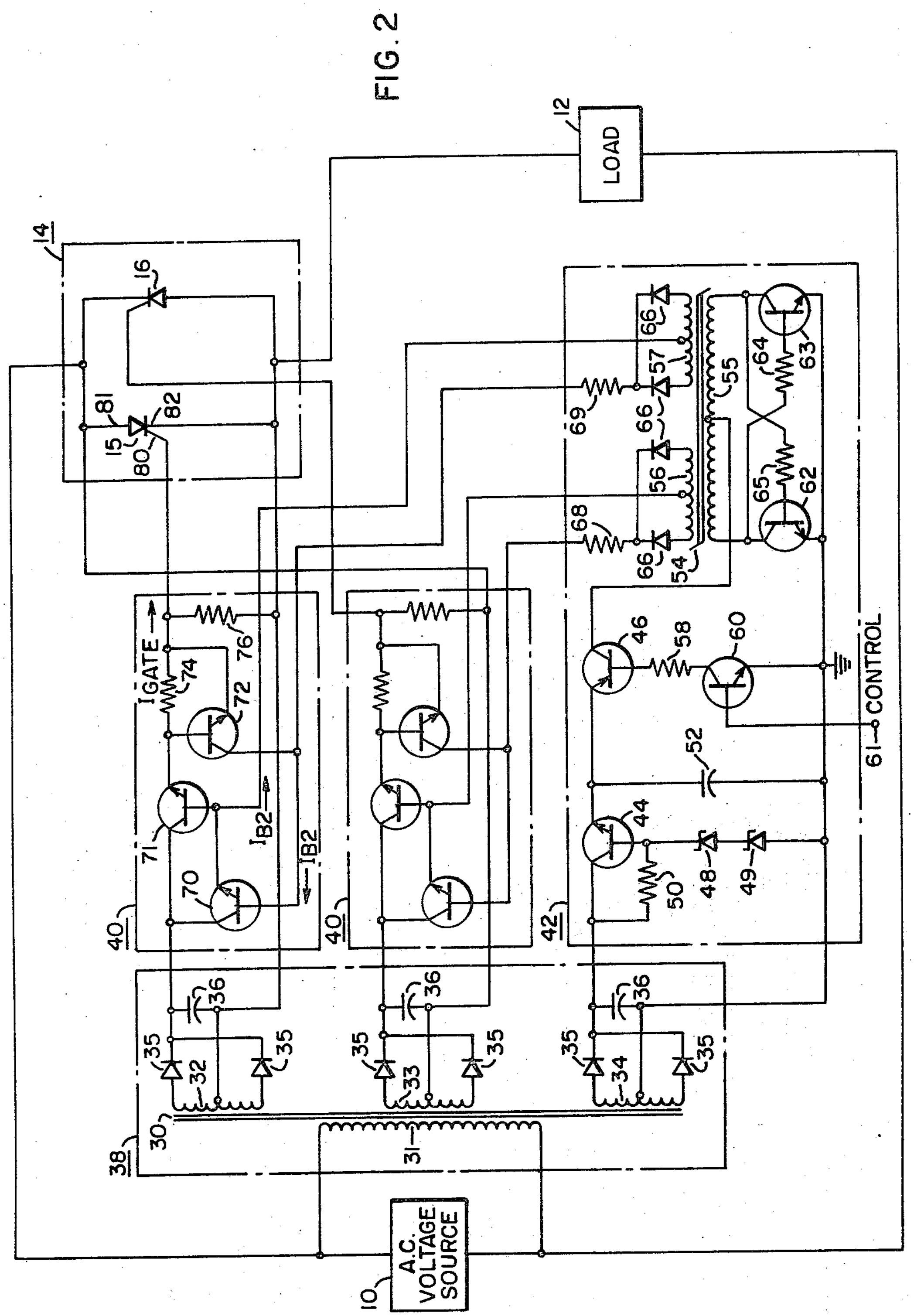
FIG. 2 is a circuit schematic of one embodiment of the present invention.

FIG. 2 shows an example of a driver circuit in accordance with this invention such as may be used as element 20 of FIG. 1. An alternating voltage source 10 is connected to a load 12 through a switch 14 comprising a pair of inverse parallel thyristors 15 and 16. A transformer 30 has a single primary winding 31 connected across the alternating voltage source and has three isolated secondary windings 32, 33 and 34. Each of the secondary windings has a pair of like poled diodes 35 connected to its outer taps for full wave rectification. A center tap on each secondary winding is connected to one side of a filter capacitor 36 the other side of which is connected to the cathode of one of the diodes. The transformer 30 with the rectifier means 35 and filter capacitors 36 are sometimes referred to herein as AC to DC converter means 38.

One of the three outputs of the AC to DC converter means 38 is connected to each of a pair of thyristor gate circuits 40 which are identical. The third output from the AC to DC converter means 38 is applied to a unit referred to as DC to DC converter 42.

The DC to DC converter 42 includes a transistor 44 (NPN in this example) whose collector is connected to the high voltage side of the filter capacitor 36, whose emitter is connected to the emitter of an opposite polarity transistor 46 and whose base is connected to a pair of series Zener diodes 48 and 49 the other end of which is connected to ground and to the other side of the filter capacitor 36. A resistor 50 is connected across the base and collector of the first transistor 44 of the DC to DC converter. Additionally, a capacitor 52 is connected across from the emitter of the first transistor 44 to ground.

The second transistor 46 has its collector connected to the center tap of the primary 55 of an additional transformer 54. The base of the second transistor 46 is connected through a resistor 58 to the collector of a third transistor 60 (NPN). The third transistor 60 has its emitter connected to ground which is at the level of the center tap of the secondary winding 34 of the first transformer 30. A control input terminal 61 is provided to the base of the third transistor 60.

On the primary 55 of the second transformer 54 are connected a pair of matching transistors 62 and 63 and a pair of matching resistors 64 and 65 cross coupled in the known manner for a free running oscillator. The oscillator transformer 54 has a pair of isolated secondaries 56 and 57 each having a diode 66 at each outer tap for full wave rectification. The diode cathodes are connected through resistors 68 and 69 respectively to each of the gate driver circuits 40 which are identical and of which only one will be described.

In this example each gate driver 40 includes a transistor amplifier comprising a pair of transistors 70 and 71 (NPN) connected in a Darlington configuration of which the collectors are connected in common to one side of the isolated secondary output of the AC to DC converter 38. The signal from the DC to DC converter 42 is applied to the base of the first transistor 70 of the amplifier configuration. A series current source is provided in the gate driver circuit 40 to the gate electrode of the thyristor 15 and includes a transistor 72 (NPN) whose base is connected to the emitter output of transistor 71 of the Darlington and whose emitter is directly connected to gate electrode 80 of the thyristor whose main terminals 81 and 82 are connected in the load circuit. Across the emitter-base of transistor 72, and in series with gate 80, is a resistor 74. Additionally, a resistor 76 is connected from the gate electrode 80 to the line connected to the center tap of the isolated secondary of the AC to DC converter 38.

In operation, when an AC voltage is applied to the primary 31 of the first transformer 30, reduced DC voltages are produced across each of the filter capacitors 36 in the AC to DC converter means 38. In the DC to DC converter 42, the initial DC voltage is series regulated by the first transistor 44 and its associated elements 48, 49, 50 and 52. Regulated DC voltage is produced on each of the secondaries 56 and 57 of the DC to DC converter and applied to each of the gate driver circuits while being isolated from control terminal 61. As base drive is applied to the driver circuit the input transistor 70 of the Darlington amplifier turns on. The gate current increases until the voltage across the resistive impedance 74 reaches the base-emitter drop of the transistor 72 across which it is connected and this serves as the regulation point of the circuit. The latter transistor 72 begins to steal base drive from the Darlington, pulling the Darlington transistors out of saturation which holds the gate current to a set value.

Since the base-emitter voltage of normal (e.g., silicon) transistors is a function of the temperature, it is seen that the gate current can be temperature compensated to minimize power dissipation. This occurs because the junction drop increases with lower temperature or decreases with higher temperature thereby regulating the gate current. The transistor base-emitter voltage drop is more temperature sensitive than the drop across the resistive element 74. Transistor 72 can be placed in thermal proximity to the thyristor 15 to provide a regulated gate current that is minimized and yet is suitably effective for the conditions in which the thyristor is operating.

Figure 3:
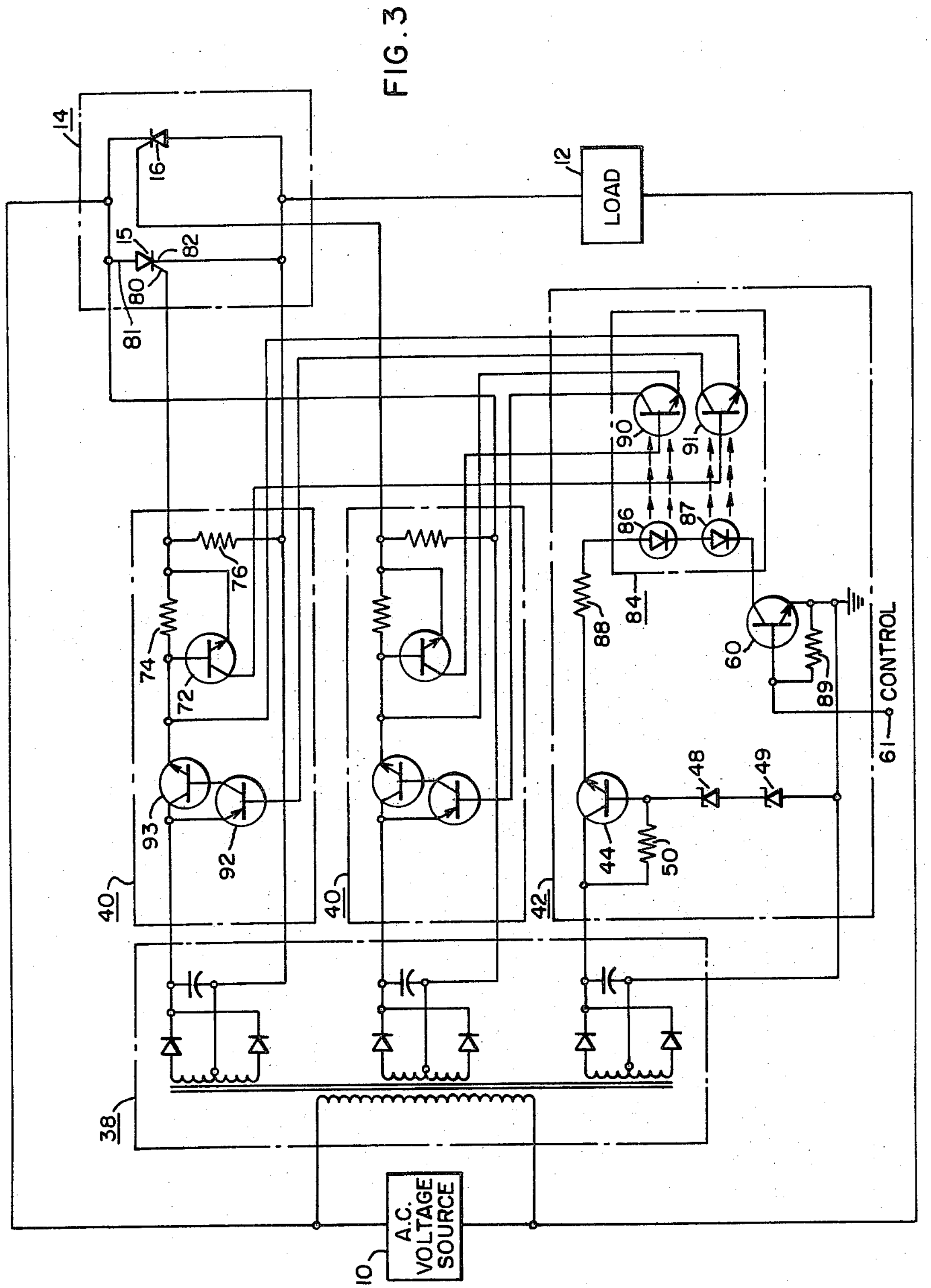
FIG. 3 is a circuit schematic of an alternative embodiment of the present invention.

Referring to FIG. 3, the alternative embodiment shown there is similar to that of FIG. 2 and like elements are identified by the same reference numerals. One difference, however, is that the DC to DC converter means 42 includes as its means for signal isolation on an optoelectronic configuration 84 instead of a transformer. The optoelectronic configuration includes a pair of serially connected light emitting diodes 86 and 87. The cathode of diode 87 is connected to the collector of control transistor 60; a resistor 89 is connected across the bases-emitter of transistor 60. The anode of diode 86 is connected through resistor 88 to the emitter of transistor 44. The light emitting diodes 86 and 87 are in optical coupled relation with phototransistors 90 and 91, respectively. The phototransistors 90 and 91, NPN in this example, are respectively connected to one of the driver circuits 40.

The driver circuits each include the current source including resistor 74 across a junction of transistor 72 in series with the gate terminal 80. To facilitate the use of the outputs of phototransistors 90 and 91, a White amplifier configuration comprising complementary transistors 92 (PNP) and 93 (NPN) is used instead of a Darlington configuration.

The embodiment of FIG. 3 is preferred over that of FIG. 2 because the optoelectronic elements are less bulky and expensive than the otherwise needed transformer.

By way of further example, the following details are presented for a specific circuit in accordance with FIG. 3.

| | |
|---|---|
| Alternating voltage source 10 | 115 V., 400 Hz.-Nominal with transient variations over a |

| | |
|---|---|
| | voltage range of from 60 V. to 180 V. |
| Thyristors **15** and **16** | Westinghouse type 250 |
| Load **12** | Circuit operated with all power factor loads from noload to short circuit. |
| Transformer **30** | RZ-213F Hypersil alloy core 1100:100 turns ratio |
| Transistor **92** | 2N2904A PNP |
| Transistor **93** | 2N2102 NPN |
| Transistor **72** | 2N2484 NPN |
| Resistor **74** | 5.6 Ω, ½ω |
| Resistor **76** | 300 Ω, ¼ω |
| Optoelectronics **84** | MCT2 Optical Isolator |
| Transistor **60** | 2N2219A |
| Resistor **89** | 30K Ω, ¼ω |
| Resistor **88** | 1K Ω, ¼ω |
| Transistor **44** | 2N2219A |
| Resistor **50** | 5K Ω, ¼ω |
| Diodes **48** and **49** | 6.8V Zener 400 M.W. |

In operation, the thyristors 15 and 16 as indentified in the above table, have required gate firing currents that typically vary from about 150 milliamperes at about −50° C to about 50 milliamperes at about +100°. The ability to reduce the gate current at elevated temperatures provides a power dissipation of 2.4 watts at about 25° C (room temperature) as compared with 6.9 watts for an otherwise equivalent scheme in accordance with the prior art.

I claim:

1. Electronic apparatus comprising in combination: a three terminal semiconductor switch having a pair of main terminals for connection in a circuit to be controlled and a third terminal to which signals are applied to initiate switching of said switch, said switch characterized by requiring, for given load circuit conditions, a minimum current at said third terminal to initiate switching that is inversely proportional to the temperature of said switch; a resistive impedance connected to said third terminal; a second semiconductor device having a P-N junction connected in parallel with said resistive impedance and in series with said third terminal, said P-N junction being characterized by a voltage drop thereacross that is inversely proportional to the temperature of said device; said switch and said device being disposed in thermal proximity to be at approximately the same temperature during operation; said resistive impedance being characterized by a voltage drop thereacross that is less thermally sensitive than the voltage drop across said P-N junction of said device to provide a current to said third terminal that is decreased with increased temperature to result in minimized power dissipation; and means, including an amplifier, for applying electrical current continuously to said parallel combination even when said switch is in a state of conduction that could be self-sustained, said amplifier being coupled with said second semiconductor device and responsive thereto to limit said current to a greater extent as temperature of said second device increases.

2. The subject matter of claim 1 wherein: said three terminal semiconductor switch is a thyristor; said second semiconductor device is a transistor; and said amplifier comprises at least one transistor.

3. The subject matter of claim 2, wherein: said means for applying electrical current comprises an alternating voltage supply and means for converting said alternating voltage to a direct voltage.

4. Electronic apparatus comprising in combination: an alternating voltage source connected across a load and switch means to control the application of said alternating voltage to said load; said switch means comprising a three terminal semiconductor device having a pair of load terminals connected in a circuit path between said source and said load and a third terminal connected to drive circuit means; said driver circuit means comprising a resistive impedance connected to said third terminal and means exhibiting a voltage drop that is inversely proportional to temperature and more temperature sensitive than said resistive impedance, said latter means connected in parallel with said resistive impedance; and means, including an amplifier, to supply continuous electrical current to said driver circuit means regardless of the conductive condition of said switch means while current to said third terminal is reduced as the voltage drop of said means exhibiting a voltage drop decreases with higher temperature, said amplifier being coupled to said means exhibiting a voltage drop and responsive thereto to limit said current to a greater extent as the temperature of said means increases.

5. The subject matter of claim 10, wherein: said switch means further comprises a second thyristor having terminals like those of said first thyristor and connected with said first thyristor in an inverse parallel configuration by said pair of load terminals of said thyristors, and a driver circuit as described is connected to said third terminal of each of said thyristors.

6. The subject matter of claim 5 wherein said means to supply continuous electrical current comprises: an AC to DC converter means having an AC input from said alternating voltage source and an isolated DC output connected to each of said driver circuits and a third isolated DC output and a DC to DC converter means powered by said third isolated output of said AC to DC converter and having an isolated DC output connected to each of said driver circuits and supplying a continuous current thereto regardless of the conductive condition of said thyristors; said DC to DC converter means having a control signal input means to initiate the placing of said thyristors in the conductive state.

7. The subject matter of claim 6, wherein: said AC to DC converter means comprises a transformer with a primary winding connected to said alternating voltage source and three isolated secondary windings, each with full wave rectifier means for each of said isolated DC outputs.

8. The subject matter of claim 6, wherein: said DC to DC converter means comprises an additional transformer connected as a free running oscillator with two isolated secondary windings for said two driver circuit means.

9. The subject matter of claim 6, wherein: said DC to DC converter means comprises a pair of light emitting diodes each in optical coupled relation with a photosensitive semiconductor device connected in circuit with one of said drive circuits.

10. The subject matter of claim 4 wherein: said three terminal semiconductor device is a first thyristor.

* * * * *